(12) United States Patent
Wilcoxson et al.

(10) Patent No.: US 6,516,438 B1
(45) Date of Patent: *Feb. 4, 2003

(54) CONCATENATED CODING SYSTEM FOR SATELLITE COMMUNICATIONS

(75) Inventors: Donald C. Wilcoxson, Redondo Beach, CA (US); Chamroeun Kchao, San Jose, CA (US); Eldad Perahia, Hermosa Beach, CA (US)

(73) Assignee: TRW Inc., Redondo Beach, CA (US)

(*) Notice: Subject to any disclaimer, the term of this patent is extended or adjusted under 35 U.S.C. 154(b) by 171 days.

This patent is subject to a terminal disclaimer.

(21) Appl. No.: 09/690,232

(22) Filed: Oct. 17, 2000

Related U.S. Application Data

(63) Continuation of application No. 09/069,681, filed on Apr. 29, 1998, now Pat. No. 6,138,261.

(51) Int. Cl.$^7$ .............................................. H03M 13/00
(52) U.S. Cl. ...................... 714/755; 714/784; 714/786; 370/307; 370/319; 370/320; 455/13.3
(58) Field of Search ................................. 714/755, 774, 714/784, 756, 786; 370/307, 316, 319, 320, 330; 375/274; 455/12.1, 13.3, 20

(56) References Cited

U.S. PATENT DOCUMENTS 4,800,570 A * 1/1989 Perrotta et al. ............. 375/274
5,473,601 A * 12/1995 Rosen et al. ................ 370/319
5,511,079 A * 4/1996 Dillon ......................... 714/774
5,625,624 A * 4/1997 Rosen et al. ................ 370/307

* cited by examiner

Primary Examiner—Emmanuel L. Moise
(74) Attorney, Agent, or Firm—McAndrews, Held & Malloy, Ltd.

(57) ABSTRACT

The present invention provides a method for custom coding uplink signals and downlink beams in a satellite communications system. The method includes the step of applying, at a ground station (100), an outer code (102) to an uplink signal to produce an outer coded uplink signal. Next, the ground station (100) applies a selected reduced complexity inner code (104) to the outer coded uplink signal to produce a concatenated coded uplink signal. The ground station (100) transmits the concatenated coded uplink signal to a satellite (110). At the satellite (110), the inner code of the concatenated coded uplink signal is decoded (116) to produce an outer coded satellite data stream. Next, the satellite (110) applies a selected inner code (120) to a portion of the outer coded satellite data stream to produce a concatenated coded satellite data stream. The satellite (110) then transmits the concatenated coded satellite data stream in a downlink beam to a destination ground station (126).

27 Claims, 3 Drawing Sheets

CONCATENATED CODING SYSTEM FOR SATELLITE COMMUNICATIONS

This is a continuation of application Ser. No. 09/069,681, filed Apr. 29, 1998, now U.S. Pat. No. 6,138,261.

BACKGROUND OF THE INVENTION

The present invention relates to coding schemes for communications networks that include satellite links. More specifically, the invention relates to adaptively applying inner and outer codes at ground stations and at a satellite in order to improve uplink and downlink efficiency, while meeting a desired bit error rate at a destination ground station.

Modern communications networks carry staggering amounts of information and a portion of the information is often transmitted through a communications satellite. A single satellite may have, for example, the equivalent of 30 or more uplink transponders, each able to receive an uplink signal with a bandwidth of 250 MHz. The resultant uplink data path may have a capacity of 8 to 10 gigabits per second or more. Where a satellite is a link in the communications network, many individual ground stations may encode, modulate, and transmit uplink signals to the satellite. Each uplink signal may consist of hundreds of individual data channels each, for example, carrying data for a telephone conversation.

Because the uplink signals are susceptible to numerous sources of corrupting interference, the ground station applies error correcting codes to the uplink signal. Error correcting codes attempt to lower the Bit Error Rate (BER) of the information-carrying signal to acceptable levels. The BER is generally defined as the ratio of incorrectly received information bits to the total number of received information bits.

In many cases a "concatenated" set of error correcting codes are applied to the data in order to lower the BER to acceptable levels. Concatenated coding refers to the sequence of coding (to be described below) in which a second coding operation is performed upon already encoded data. The "outer code" of the concatenated coding is the first code applied (the block code in the following description), while the "inner code" of the concatenated coding is the second code applied (the convolutional code in the following description). Alternatively, an additional block code may be used as the inner code (or a sequence of block codes (as the "inner" code) may be used).

The first code the ground station applies is typically a block code. A codeword in a block code consists of k information bits, and r parity bits. The codeword is therefore n=k+r bits in length. A variety of block codes known as Reed-Solomon codes may be used to encode the uplink signals.

As noted above, block codes are generally organized on the basis of bits. Reed-Solomon block codes, however, are organized on the basis of groups of bits referred to as symbols. To form symbols, an incoming serial bit stream may be stored as sequences of m individual bits (a symbol). The Reed-Solomon code has k information symbols (rather than bits), r parity symbols, and a total codeword length of n=k+r symbols. For 8-bit symbols, a Reed-Solomon codeword is typically 255 symbols in length. Allowing the codeword to correct up to 16 symbols requires 32 parity symbols, thereby leaving 223 data symbols (for an effective code rate of 223/255 (approximately 7/8)).

As part of the concatenated coding scheme, an additional level(s) of coding is applied by the ground station. For example, the ground station may further encode the block encoded uplink signals with a convolutional code to reduce the bit error rate (BER) of the uplink signal to even lower levels. A convolutional code is a type of error correcting code which transforms an input sequence of bits into an output sequence of bits through an encoder (a finite-state machine), where additional bits are added to the data stream to allow for error-correcting capability. Typically the amount of error-correction capability is proportional to the amount of additional bits added and the memory present in the encoder. The constraint length, K, of a convolutional code is proportional to the encoder's memory and the rate of the convolutional code (say m/n, with m<n) describes how many additional bits are added for every m information bits (input) (i.e., n–m bits added for each m info bits.) The decoding complexity of a convolutional code increases exponentially with the constraint length.

Additional information on block codes and convolutional codes may be found, for example, on pages 166–175 in The Communications Handbook, (Jerry D. Gibson ed., IEEE Press 1997). Pages 166–175 of The Communications Handbook are incorporated herein by reference in their entirety.

Satellites receive the encoded uplink signals and transmit downlink beams to the ground stations. Before a satellite transmits a downlink beam, however, the satellite may perform various signal processing operations on the received uplink signal including demodulation, decoding, switching, and multiplexing. A satellite that demodulates uplink signals and remodulates data for downlink beam in referred to as "regenerative". For example, a satellite that demodulates uplink signals, decodes the signals, and recodes the signals is typically referred to as a "regenerative decode/recode" system or more simply "decode/recode". On the other hand, a satellite which simply forwards the received uplink signals unaltered to a ground station is typically referred to as a "bent pipe" system. In "(regenerative) end-to-end" coding, the satellite typically demodulates the (coded) uplink signal and remodulates the data for transmission in a downlink beam, but without decoding the data on board the satellite.

While concatenated coding is effective at reducing BER, it also faces certain difficulties. In order for the satellite to do significant processing on the data contained in a concatenated coded uplink signal, the satellite must decode the inner code (often a convolutional code) on the uplink signal. As noted above with respect to convolutional codes, the decoding complexity increases exponentially with increasing constraint length. In most instances, the constraint length needed to achieve tolerable BER render the inner code too complex to decode on the satellite without using inordinate amounts of complicated processing hardware, power, and time.

The downlink beams produced by the satellite and transmitted to ground stations often include data (often in Time Division Multiplexed (TDM) form) for hundreds of users (for example, telephony users). Typically, the coding on the uplink signal is designed to cover the worst-case channel conditions (both uplink and downlink) likely experienced by the user at any given time. The worst case channel condition may be associated with an (infrequent) rain storm which causes significant signal interference, for example. In the past, the combination of the inner code and the outer code has been implemented using relatively large constraint length convolutional codes and long block codes to achieve downlink beam performance tailored to the worst case channel condition.

Most ground stations, however, do not experience the worst case channel conditions at any given time.

Furthermore, the satellite typically does not contain sufficient power or processing capability to completely decode the inner code and outer codes and recode the data appropriately for each ground station or individual channel condition. Thus, bandwidth is wasted by over-encoding the uplink signal and downlink beam with error correcting information that is not needed by most ground stations in order to use so-called "end-to-end" coding in order to alleviate the need for decoding on board the satellite. Wasted bandwidth results in inefficient communication, reduced throughout, and lost revenues.

In the past, satellite links have not adapted their coding schemes to efficiently use bandwidth and match the required ground station BER. For example, U.S. Pat. No. 5,625,624 entitled "HIGH DATA RATE SATELLITE COMMUNCIATIONS SYSTEM" to Rosen et al. describes a satellite communications system in which the ground station uses concatenated coding. The satellite demodulates the uplink signal and remodulates the downlink beam for transmission. The system of the '624 patent thus describes an end-to-end coding scheme, i.e., the satellite does not decode either the inner or the outer code on the uplink signal. Furthermore, the system described in the '624 patent is unable to adapt the inner or outer code according to individual user BERs.

As another example, U.S. Pat. No. 5,473,601 entitled "FREQUENCY REUSE TECHNIQUE FOR A HIGH RATE SATELLITE COMMUNICATION SYSTEM" to Rosen et al. discloses a system in which both the inner code and the outer code on the uplink signal are decoded. The system of the '601 patent thus discloses a decode/recode approach to processing the uplink signal. A decode/recode approach incurs the extra cost, complexity, and power comsuption needed to decode two set of codes on the uplink signal. Futhermore, the '601 patent does not describe a system which adaptively adjusts inner or outer codes to achieve the BERs required for individual ground stations.

U.S. Pat. No. 4,800,570 entitled "CONCATENATED CODE-DECODE SYSTEM FOR THE PROTECTION AGAINST INTERFERENCE OF DIGITAL TRANSMISSIONS THROUGH AN INTERMEDIATE REGENERATIVE REPEATER" to Perrotta et al. describes another coding approach. In the '570 patent, no inner code is applied to the transmitted signal. At the satellite, the transmitted signal is received and demodulated. An inner code is then applied to the transmitted signal before remodulation and transmission. The '570 patent, however, does not describe adaptively adjusting inner or outer codes to tailor the downlink beam BER according to the needs of individual ground stations.

A need has long existed in the industry for an improved uplink signal and downlink beam coding technique, which overcomes the disadvantages discussed above and previously experienced.

BRIEF SUMMARY OF THE INVENTION

It is an object of the present invention to provide an uplink signal and downlink beam concatenated coding scheme which uses a reduced complexity inner code on the uplink signal for efficient decoding on a satellite.

It is another object of the present invention to allow a satellite to adapt uplink and downlink beam coding according to a predetermined BER required by the destination ground station.

It is another object of the present invention to allow a satellite to adapt uplink and downlink beam coding according to a BER selected by market driven criteria.

It is yet another object of the present invention to allow individual data channels in a single downlink beam to be individually coded to achieve a given BER.

The present invention provides a method for custom coding a downlink beam by a satellite. The method includes the step of applying, at a ground station, an outer code to an uplink signal to produce an outer coded uplink signal. The outer code may be a relatively complex outer code, for example a Reed-Solomon (255, 223) block code.

In addition, the ground station applies a reduced complexity inner code to the outer coded uplink signal. The ground station thereby produces a concatenated coded uplink signal that is subsequently transmitted to a satellite. The reduced complexity inner code may be a short block code, for example a (12,8) or (16, 8) block code, or a short constraint length convolutional code, for example, a constraint length 3 convolutional code. The choice of inner code on the uplink can also be adaptively driven to meet market criteria, channel condition, required BER, or other criteria. The choice of inner code may therefore vary according to the criteria cited above.

The satellite decodes the reduced complexity inner code of the concatenated coded uplink signal to produce an outer coded satellite data stream. The satellite thereby has access to the outer coded data channels which form the outer coded uplink signal. The satellite may then apply any selected inner code to the data channels individually, or to a downlink beam in its entirety.

The satellite applies a selected inner code to the outer coded satellite data stream to produce a concatenated coded downlink signal. The selected inner code may be chosen according to numerous criteria. For example, the satellite may determine the selected inner code according to service level (for example, a guaranteed minimum throughput) and cost of service. Alternately, the satellite may determine the selected inner code according to a desired downlink BER for any number of ground stations (the downlink "inner" code may be very complex since the ground terminal is more able to deal with decoding complexity than was the satellite.). After the satellite has selected the appropriate inner code and produced the concatenated coded downlink signal, the satellite transmits the concatenated coded downlink signal in a downlink beam to a ground station.

DETAILED DESCRIPTION OF THE INVENTION

Figure 1:
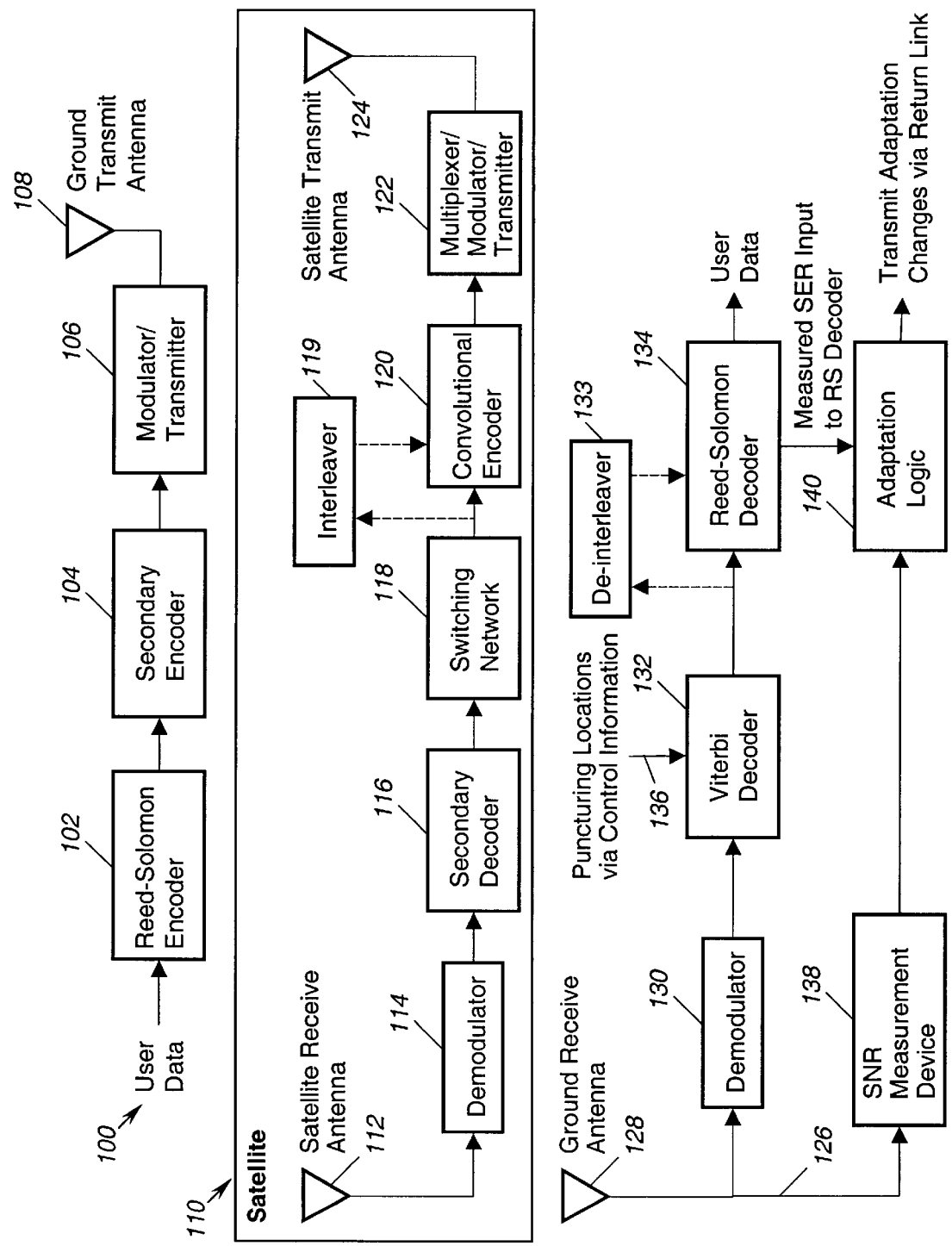
FIG. 1 shows a block diagram of originating ground station concatenated coding, satellite decoding and recoding, and destination ground station receiving.

Turning now to FIG. 1, that figure shows an originating ground station 100 including a concatenated coding processing block diagram. The ground station 100 includes a Reed-Solomon encoder 102, a secondary encoder 104, a modulator-transmitter 106, and a ground transmit antenna 108. A satellite, generally indicated 110, receives uplink signals transmitted from the ground transmit antenna 108.

The satellite 110 includes a receive antenna 112, a demodulator 114, and a secondary decoder 116. The satellite 110 also includes a switching network 118, a convolutional encoder 120, and a multiplexer-modulator-transmitter 122 as well as a transmit antenna 124. A Reed-Solomon Symbol-by-Reed-Solomon Symbol interleaver 119 may be used on the data output from the switching network 118. A destination ground station, generally indicated 126, receives downlink beams transmitted from the transmit antenna 124.

The destination ground station 126 includes a receive antenna 128, a demodulator 130, a Viterbi decoder 132 and a Reed-Solomon decoder 134. A Reed-Solomon Symbol-by-Reed-Solomon Symbol de-interleaver 133 may be used to undo the interleaving effect of the interleaver 119. The Viterbi decoder may accept puncturing information or other control information through a control information input 136. The destination ground station may optionally include a Signal to Noise Ratio (SNR) measurement device 138 and adaptation logic 140.

Referring again to the originating ground station 100, it employs a concatenated coding scheme using the Reed-Solomon encoder 102 and the secondary encoder 104. The Reed-Solomon encoder 102 applies the outer code of the concatenated code to the input user data. The Reed-Solomon encoder 102 typically applies a relatively complex outer code, for example, a (255, 223) code. As noted above, a (255, 223) code produces 32 error protection symbols for every 223 information symbols, resulting in a block length of 255 symbols. Other relatively long block codes and Reed-Solomon codes are also suitable.

After the Reed-Solomon encoder 102 applies the outer code to the user data, the secondary encoder 104 applies an inner code to the user data. The Reed-Solomon encoder 102 and the secondary encoder 104 thus function in concert to produce a concatenated coded uplink signal. As will be discussed in more detail below, the secondary encoder 104 provides adaptive error control coding for the uplink signal.

The secondary encoder 104 applies a reduced complexity inner code, for example, a short length block code or short constraint length convolutional code. The coding rate of the variable rate coder may be adjusted by selecting different codes (for example, a (12,8) cyclic code or an extended Nordstrom-Robinson (16,8) code) or by modifying a single code. For example, the code rate of a convolutional code may be adjusted by shortening, puncturing, or expanding techniques. By allowing the complexity and rate of the inner code to change, the uplink signal can be error coded appropriately for the required uplink BER. Thus, the uplink signal need not be over-coded in cases where the uplink channel conditions do not warrant extra coding.

A definition of what constitutes a reduced complexity inner code may be given heuristically. One heuristic specifies that a reduced complexity block code uses 8–20 bit long codewords or symbols (as opposed to the above example of a (255, 223) Reed-Solomon outer code in which the codeword is 255*8=2040 bits). A reduced complexity convolutional code may, for example, have a constraint length less than 5. Because advances in processing technology may render today's complex codes tomorrow's non-complex codes, another heuristic indicates that a reduced complexity code uses no more than 10–20% of the available processing power (measured, for example, as the ratio of the number of clock cycles used to decode information to the number of clock cycles used to process the decoded information on board the satellite).

Reduced complexity inner codes allow the satellite to decode the inner code by expending far less computational resources than are required to decode a complex inner code. As a result, the satellite is able to remove the inner code efficiently and may then apply other selected inner codes on the downlink beam. The satellite itself, or a ground station, may then more readily provide multiple codes or in-orbit reconfiguration (through software or firmware updates) of the codes used in the satellite. Furthermore, it is noted that the outer code may also be implemented as a variable rate outer code.

Referring again to the satellite 110, the concatenated coded uplink signal is received on receive antenna 112 and demodulated by the demodulator 114. The ground station 100 and satellite 110 may use a wide variety suitable of modulation schemes, including Quadrature Phase Shift Keying (QPSK) and Binary Phase Shift Keying (BPSK).

The satellite 110 next uses the secondary decoder 116 to decode the inner code on the concatenated coded uplink signal. The satellite thereby produces an outer coded satellite data stream. It will be appreciated that the secondary decoder 116 matches the encoding scheme of the secondary encoder 104 with an appropriate decoding scheme. Because the inner code is a reduced complexity code, the secondary decoder 116 may be implemented, for example, as a short look up table in Random Access Memory (RAM) or Read Only Memory (ROM), flash memory, or as a software algorithm.

As noted above, an uplink signal may include dozens of individual data channels. After the satellite 110 removes the inner code from the uplink signal, the satellite has more direct access to the individual data channels in the uplink signal. The switching network 118 may, for example, operate on the individual data channels, to switch all the data channels destined for a particular downlink beam into one of many internal satellite data streams. The switching network 118 may also group data channels by required downlink BER, priority, or by market driven criteria such as service cost or guaranteed minimum throughput.

The output of the switching network 118 is routed to a convolutional encoder 120 (or a Reed-Solomon Symbol-by-Reed-Solomon Symbol interleaver 119, if present). The convolutional encoder 120 applies a selected inner code to the outer coded satellite data stream. The resultant concatenated coded satellite data stream is provided to the multiplexer-modulator-transmitter 122 in order to generate a downlink beam with the transmit antenna 124.

The convolutional encoder 120 may, for example, apply a constraint length 7 or 8 (or longer) convolutional code to the outer coded satellite data stream. Because different ground stations typically experience different downlink conditions, the code rate of the convolutional code applied by the convolutional encoder 120 may be adapted to meet the channel conditions. For example, the convolutional code may be adapted by puncturing a standard 1/n rate convolutional code. Puncturing removes regularly spaced code bits from the output of the convolutional encoder. For example, puncturing every 4th bit in the output stream from the encoder bit of a rate 1/2 code creates a rate 2/3 code.

Adapting the code rate may be done with respect to an entire downlink beam or may be done on a data channel by data channel basis. For example, assuming each data channel is assigned to a Time Division Multiplexed (TDM) slot in a downlink beam, the convolutional code may be terminated during each TDM slot, thereby "block"-ing the code. The ground station may then decode the TDM slot using a standard convolutional decoder, using the puncturing pattern utilized by that data channel.

Alternatively, the convolutional encoder 120 may puncture the code differently in each time slot without terminating the code. The satellite may then pass the puncturing locations to the ground station, for example, in an already existing control channel. The ground station may then decode the downlink beam by referencing the known puncturing locations. For short TDM intervals, avoiding terminating the code by time slot may lead to substantial increases in throughput. As noted above, the selected inner code applied by the convolutional encoder 120 may also reflect criteria ranging from required downlink BER to market driven criteria such as a guaranteed minimum throughput.

Again with reference to FIG. 1, the destination ground station 126 receives downlink beams transmitted from the transmit antenna 124. A demodulator 130 removes any modulation applied by the multiplexer-modulator-transmitter 122. A Viterbi decoder 132 may be used to decode the convolutional code applied by the convolutional encoder 120. As noted above, puncturing locations may be provided to the Viterbi decoder 132 via a control channel 136 also transmitted by the satellite 110. The Viterbi decoder 132 may be replaced by another suitable convolutional code decoder, for example, one using a sequential decoding algorithm.

After the Viterbi decoder 132 has decoded the inner code on the received downlink beam, (and the Reed-Solomon Symbol-by-Reed Solomon Symbol de-interleaver has de-interleavered the Reed-Solomon Symbols) the Reed-Solomon decoder 134 removes the outer code applied in the originating ground terminal 100. The original data channels are thereby recovered and may be forwarded to circuitry for additional processing or to actual ground base users (not shown). Optionally, the destination ground station 126 may provide an SNR measurement device 138 which makes determinations about the signal-to-noise ratio of the downlink beam (i.e., downlink channel condition).

The SNR measurements may then be forwarded to the adaptation logic 140. The adaptation logic 140 uses the SNR measurements in addition to Symbol Error Rate (SER) measurements (referring to SER at the input for the Reed-Solomon decoder, as provided by the Reed-Solomon decoder 134) to provide adaptation changes via uplink signals to the satellite 110. The adaptation changes, for example, may indicate that the downlink channel conditions are more favorable than anticipated and that the satellite may reduce the amount of inner coding on the data channel or the downlink beam. Favorable channel conditions are generally indicated by high SNR measurement values and low SER values. Additonally, the adaptation logic may determine that less (or more) coding is needed on the uplink, and that information may be forwarded through the satellite to the originating ground station.

The adaptive error control coding described above ensures that no more coding than is necessary is applied to uplink signals and downlink beams. The adaptive coding changes with changing channel conditions to maintain the coding rate appropriate at any given time. Notably, uplink coding is independent of downlink coding. As a result, channel conditions that effect the uplink, but not the downlink, do not affect the information throughput on the downlink. As an example, a rain storm affecting an originating ground station may require that the ground station apply heavy coding to the uplink signal. If there is no rain storm affecting the destination ground station, however, the satellite need not apply heavy coding on the downlink beam. Additional downlink bandwidth is thereby made available through adaptive coding. Maximizing throughput increases revenues for the satellite operator. An additional benefit of adaptive coding is that it may be used in conjunction with or to replace power control in overcoming co-channel and adjacent channel interference. Thus, additional coding may be provided where the potential for interference between individual data channels exists.

Figure 3:
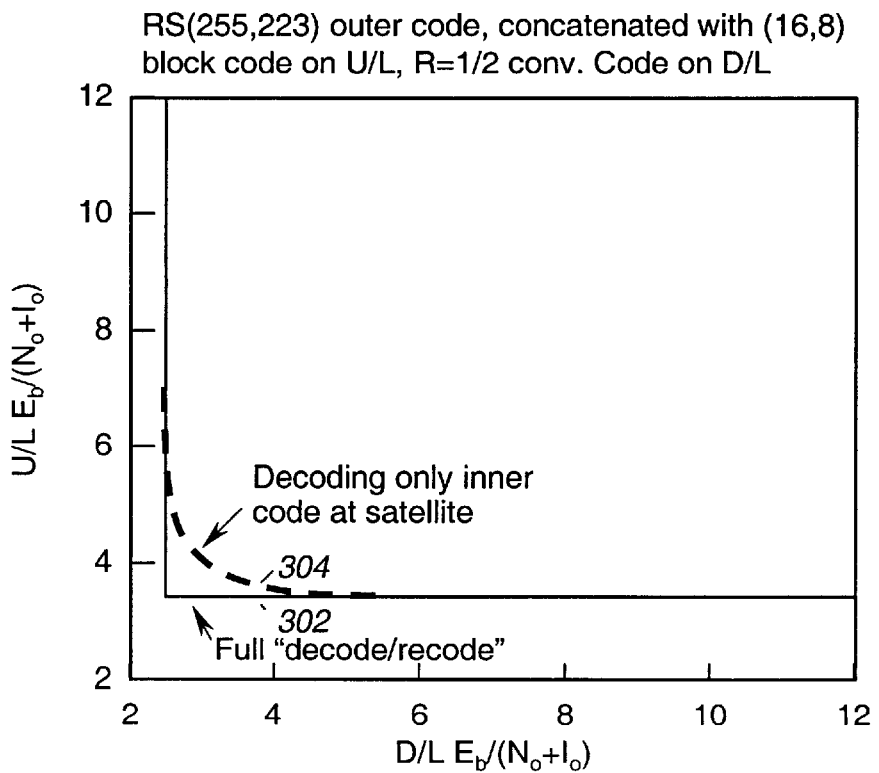
FIG. 3 illustrates the performance difference in decoding strategies for concatenated codes.

The advantages arising from adaptive coding are accompanied by reduced complexity compared, for example, with a "decode/recode" system described above. FIG. 3, for example, shows the difference in performance between full decoding of both the inner code and outer code, and full decoding of only the reduced complexity inner code. In FIG. 3, the vertical axis represents values for $Eb/(No+Io)$ on the uplink while the horizontal axis represents values for $Eb/(No+Io)$ on the downlink. Eb represents the transmitted energy per bit, No represents the power spectral density of ambient noise, and Io represents the power spectral density from interfering signals (such as from co-channel or adjacent channel interference).

FIG. 3 illustrates a full decode curve 302 and an inner decode-only curve 304. Both curves 302 and 304 are contour lines defining the values of uplink and downlink $Eb/(No+Io)$ needed to achieve a given BER at the destination ground station. Points above and to the right of the curves 302 and 304 represent BERs lower (better) than the given target BER. Points below and to the left of the curves 302 and 304 represent BERs higher (worse) than the given target BER. A given BER may also be treated as an equivalent Symbol Error Rate (SER), however.

The curves in FIG. 3 are drawn assuming a Reed-Solomon (255, 223) outer code concatenated with a (16,8) block code on the uplink and a rate 1/2 convolutional code on the downlink. FIG. 3 illustrates that only marginally better $Eb/(No+Io)$ values are required to achieve the BERs achieved by full decode/recode systems.

Figure 4:
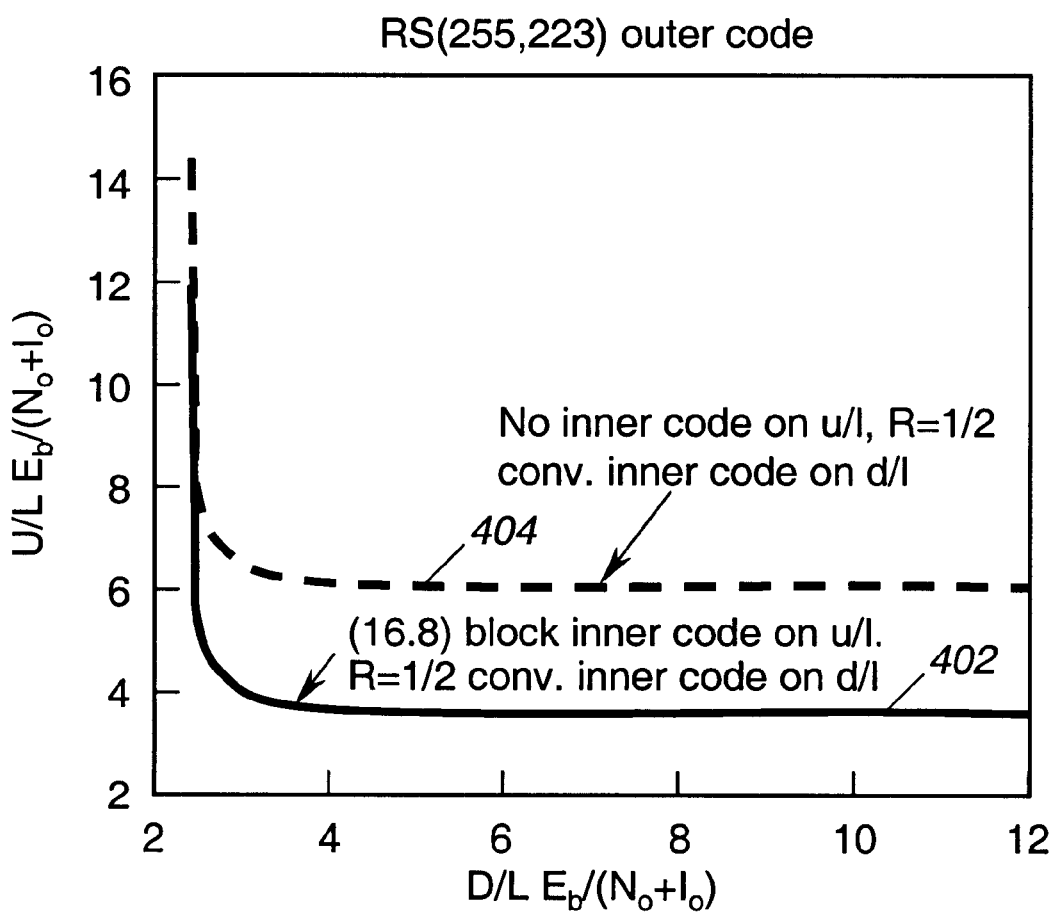
FIG. 4 illustrates the performance difference on an uplink signal between a short block inner code and no inner code.

FIG. 4 shows a comparison of a reduced complexity ((16,8) block code) inner code system (curve 402) against a system that applies no inner code (curve 404) on the uplink (for example the system described in the '570 patent). As in FIG. 3, a Reed-Solomon (255, 223) block code is assumed to be used as the outer code. For both systems, a rate 1/2 convolutional code is assumed applied as the downlink inner code. FIG. 4 illustrates that the addition of a reduced complexity inner code on the uplink substantially reduces the Eb/No required to achieve a given BER.

The performance gain attributable to a reduced complexity inner code comes with only a minor increase in complexity (due to decoding the inner code on the satellite 110). As noted above, the decoding for a reduced complexity inner code may be implemented in hardware or software, which allows for reconfigurability after the satellite 110 is launched. Reconfiguration may be used for example, to implement new types of codes and decoding algorithms in the satellite 110.

Figure 2:
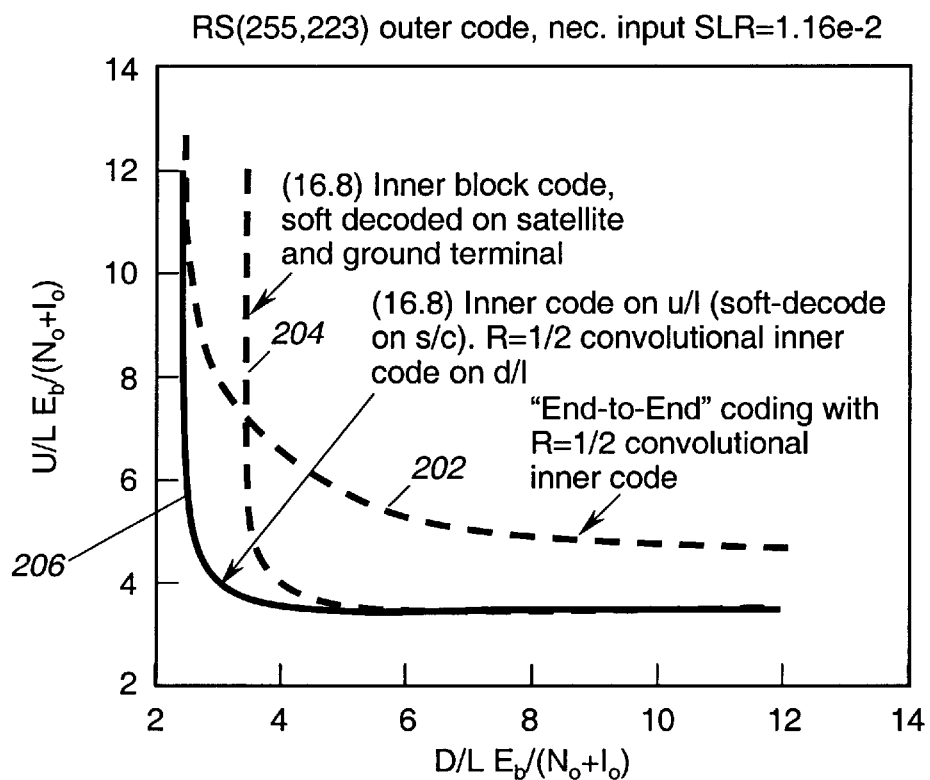
FIG. 2 shows an example of the performance of three concatenated coding schemes.

Using reduced complexity inner codes also results in performance increases over end-to-end systems because decoding of the inner codes yields better uplink performance. As shown in FIG. 2, curve 202 represents end-to-end coding with a rate 1/2 convolutional code inner code (which is maintained on the downlink due to the end-to-end coding scheme). Curve 204 represents the performance of a system using a reduced complexity (16,8) inner block code on the uplink and the downlink. Curve 206 represents the performance of a system using a mixed scheme of a (16,8) inner code on the uplink and a rate 1/2 convolutional code inner code on the downlink. FIG. 2 assumes a Reed-Solomon (255, 223) code as the outer code. Curves 202–206 trace the boundary of a Symbol Error Rate of $1.16 \times 10^{-2}$ (which equates to a BER to the destination ground station of $10^{-10}$). FIG. 2 shows a significant performance advantage for the system operating on curve 206 over end-to-end coding systems.

In addition to the performance advantage discussed above, the present invention may also be used to reduce the complexity of the inner coding on the satellite 110 by using a single convolutional encoder to encode an entire downlink beam. As discussed above, individually puncturing a convolutional code on a data channel basis allows a single convolutional encoder to simultaneously code data channels for multiple users at varying rates. The convolutional coder may then adapt to downlink channel conditions without the need for complex multiplexing and/or buffering or multiple convolutional coders.

For channels which may undergo significant fading (such as rain attenuation during a heavy thunderstorm) and many different levels of fading (such as tropical areas with varying amounts of rainfall), the coding scheme described above allows many different levels of coding to be applied to the downlink beam with only a marginal increase in overhead. The satellite 110 need only communicate the puncture pattern (or terminate the convolutional code in each time slot) to the ground stations.

While particular elements, embodiments and applications of the present invention have been shown and described, it is understood that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A method for custom coding uplink signals at a ground station and downlink beams at a satellite, the method comprising the following steps:
    applying, at an originating ground station, an outer code to a first uplink signal to produce an outer coded uplink signal;
    applying a reduced complexity inner code to said outer coded uplink signal to produce a concatenated coded uplink signal;
    transmitting said concatenated coded uplink signal to a satellite;
    decoding, at said satellite, said reduced complexity inner code on said concatenated coded uplink signal to produce an outer coded satellite data stream;
    applying at least one selected inner code at said satellite to said outer coded satellite data stream to produce a concatenated coded satellite data stream;
    transmitting said concatenated coded satellite data stream in a downlink beam to a destination ground station.

2. The method of claim 1, wherein said step of applying a reduced complexity inner code applies a reduced complexity block code.

3. The method of claim 1, wherein said step of applying a reduced complexity block code applies a (16,8) block code.

4. The method of claim 1, wherein said step of applying a reduced complexity block code applies a (8,4) block code.

5. The method of claim 1, wherein said step of applying a reduced complexity block code applies a (12,8) block code.

6. The method of claim 1, wherein said step of applying a reduced complexity inner code applies a reduced complexity convolutional code.

7. The method of claim 6, wherein said step of applying a reduced complexity convolutional code applies a convolutional code with a constraint length between 2–4 inclusive.

8. The method of claim 1, wherein said step of applying a reduced complexity inner code applies an inner code requiring less than approximately 20% of available processing power at said satellite to decode.

9. The method of claim 1, wherein said step of applying a selected inner code applies said selected inner code based to at least one individual data channel located in said outer coded satellite data stream.

10. The method of claim 1, wherein said step of applying a selected inner code applies said selected inner code to an individual downlink beam.

11. The method of claim 1, wherein said step of applying a selected inner code adaptively punctures a single inner code in accordance with a BER required for each individual data channel in said outer coded satellite data stream.

12. The method of claim 1, wherein said step of applying a selected inner code chooses said selected inner code according to a desired downlink BER.

13. The method of claim 1, wherein said step of applying a selected inner code chooses said selected inner code according to market driven criteria.

14. The method of claim 1 wherein said step of applying a reduced complexity inner code comprises adapatively selecting inner code based upon at least one of measured downlink signal-to-noise ratio and symbol error rate.

15. The method of claim 1 comprising interleaving coded Reed Solomon Symbols before applying selected inner code at said satellites.

16. A method for custom coding downlink beams at a satellite, the method comprising the following steps:
    receiving at a satellite a concatenated coded uplink signal including a reduced complexity inner code;
    decoding, at said satellite, said reduced complexity inner code on said concatenated coded uplink signal to produce an outer coded satellite data stream;
    applying at least one selected inner code at said satellite to said outer coded satellite data stream to produce a concatenated coded satellite data stream; and
    transmitting said concatenated coded satellite data stream in a downlink beam to a destination ground station.

17. The method of claim 16, wherein said reduced complexity inner code is a reduced complexity block code.

18. The method of claim 16, wherein said reduced complexity inner code is a reduced complexity convolutional code.

19. The method of claim 18, wherein said reduced complexity convolutional code applies is convolutional code with a constraint length between 2–4 inclusive.

20. The method of claim 16, wherein said step of decoding said reduced complexity inner code requires less than approximately 20% of available processing power at said satellite.

21. The method of claim 16, wherein said step of applying a selected inner code applies said selected inner code to at least one individual data channel located in said outer coded satellite data stream.

22. The method of claim 16, wherein said step of applying a selected inner code applies said selected inner code to an individual downlink beam.

23. The method of claim 16, wherein said step of applying a selected inner code chooses said selected inner code according to a desired downlink BER.

24. The method of claim 16, wherein said step of applying a selected inner code adaptively punctures a single inner code in accordance with a BER required for each individual data channel in said outer coded satellite data stream.

25. The method of claim 16 wherein said step of applying a selected inner code adaptively selects an inner code based upon measured downlink signal to noise ratio or symbol error rate.

26. The method of claim 16 wherein said step of applying a reduced complexity inner code comprises adapatively selecting inner code based upon at least one of measured downlink signal-to-noise ratio and symbol error rate.

27. The method of claim 16 comprising interleaves coded RS Symbols before applying selected inner code at said satellites.

* * * * *